United States Patent [19]

Liebert

[11] Patent Number: 4,724,324

[45] Date of Patent: Feb. 9, 1988

[54] METHOD AND APPARATUS FOR ION BEAM CENTROID LOCATION

[75] Inventor: Reuel B. Liebert, Peabody, Mass.

[73] Assignee: Varian Associates, Inc., Palo Alto, Calif.

[21] Appl. No.: 934,011

[22] Filed: Nov. 24, 1986

[51] Int. Cl.$^4$ ............................................. H01J 37/04
[52] U.S. Cl. ................................. 250/397; 250/396 R; 324/71.3
[58] Field of Search .................. 250/396 R, 397, 398, 250/492.2, 492.21, 492.3; 324/71.3

[56] References Cited

U.S. PATENT DOCUMENTS

| | | | |
|---|---|---|---|
| 3,612,858 | 10/1971 | Parry | 324/71.3 |
| 3,749,963 | 7/1973 | Fredrickson et al. | 250/398 |
| 3,925,640 | 8/1976 | Boox et al. | 250/397 |
| 4,290,012 | 9/1981 | Berte et al. | 324/71.3 |
| 4,608,493 | 8/1986 | Hzyafuji | 250/397 |

FOREIGN PATENT DOCUMENTS 0079275 7/1981 Japan ................................ 250/387

OTHER PUBLICATIONS

W. N. Hammer et al, "A Technique for Measuring, Displaying, Recording, and Modifying the Spatial Uniformity of Implanted Ions," Journal of Applied Physics, vol. 47, No. 5, May 1976, pp. 2161-2164.

N. Natsuaki et al, "Spatial Dose Uniformity Monitor for Electrically Scanned Beam," Review of Scientific Instruments, 49(9), Sep. 1978, pp. 1300-1304.

*Primary Examiner*—Bruce C. Anderson
*Assistant Examiner*—Paul A. Guss
*Attorney, Agent, or Firm*—Stanley Z. Cole; Gerald M. Fisher; Terrence E. Dooher

[57] ABSTRACT

Method and apparatus for locating the centroid along a line section of an ion beam in a vacuum chamber, requiring no moving parts and requiring only two electrical conductors passing through the wall of the vacuum chamber. An array of Faraday cup current sensors is positioned along a line in the path of the beam at predetermined distances from a reference point, so that each sensor intercepts a component of the beam. A first plurality of resistors each has one end connected to one of the beam current sensors, has a value proportional to the distance between the beam current sensor to which it is connected and the reference point, and has its other end connected to a first common point. A second plurality of resistors having values equal to each other each has one end connected to one of the beam current sensors, has a value much greater than the largest of the first plurality of resistors, and has its other end connected to a second common point. The first and second common points are connected through the wall of the vacuum chamber to a divider. The current supplied to the second common point is divided by the current supplied to the first common point to provide the distance between the reference point and the projected centroid of the ion beam.

11 Claims, 2 Drawing Figures

METHOD AND APPARATUS FOR ION BEAM CENTROID LOCATION

FIELD OF THE INVENTION

This invention relates to charged particle beam processing of materials and, more particularly, to a method and apparatus for locating the intensity centroid of a charged particle beam. The technique is useful in, but is not limited to, ion implantation of semiconductor wafers.

BACKGROUND OF THE INVENTION

Ion implantation has become a standard technique for introducing impurity dopants into semiconductor wafers. A beam of ions is generated in a source and is directed with varying degrees of acceleration toward a target wafer. Ion implantation systems typically include an ion source, ion optics for removing undesired ion species and for focusing the beam, means for deflecting the ion beam over the target area and an end station for mounting and exchanging wafers.

In the implantation of semiconductor wafers for large scale integrated circuits, it is required that the implanted dose be carefully controlled in magnitude and be highly uniform over the area of the wafer to insure uniform and predictable device characteristics. The ion beam used to implant the wafer has a cross-sectional dimension of up to 5 inches and exhibits a variation in intensity over its cross-sectional area. In rotating disc or spoke systems where a relatively large area beam is utilized and the area element being implanted is a function of radius, a knowledge of the beam distribution pattern is particularly important. If the radial intensity centroid of the ion beam is displaced from the nominal beam axis, the integrated dose distribution pattern is displaced relative to its nominal location and both the sheet resistance and the uniformity of the implanted wafer are adversely affected. Therefore, it is important to know the location of the intensity centroid of the ion beam.

In the past, the intensity centroid of the ion beam in ion implantation systems has not been determined. However, various diagnostic devices have been used in charged particle acceleration systems to determine the shape of the beam distribution. A moving wire has been used to measure beam current, either directly through the wire, or by secondary electron current measurement. Current has been measured behind a moving slit or aperture. Individual Faraday cups for measuring current have been placed at different locations in the beam or behind an aperture plate. The beam has been scanned over one or more apertures or slits. A microcalorimeter has been used to measure beam intensity, either with the micro-calorimeter being moved, or with the beam being scanned over the micro-calorimeter. Also, the beam can be located by optical omission from the beam hitting a surface. These techniques have several problems and disadvantages. Any of the techniques requiring either a moving beam or a moving beam monitor require an accurate motion control device and introduce mechanical complexity. Mechanical devices are undesirable within the vacuum chamber of an ion implanter because they tend to introduce particulate contamination. Individual Faraday cups do not require mechanical motion but, in the past, have required either multiple vacuum feedthroughs for conductors from each Faraday cup or active electronic circuitry within the vacuum chamber. Such electronic circuitry may cause contamination and outgassing problems within the chamber.

It is a general object of the invention to provide improved methods and apparatus for charged particle beam centroid location.

It is another object of the present invention to provide methods and apparatus for charged particle beam centroid location requiring no moving parts.

It is a further object of the present invention to provide methods and apparatus for charged particle beam centroid location which minimize the possibility of contamination within a vacuum chamber.

Yet another object of the present invention is to provide methods and apparatus for charged particle beam centroid location requiring only two electrical feedthroughs between the vacuum chamber and the external environment for the centroid location function.

SUMMARY OF THE INVENTION

According to the present invention, these and other objects and advantages are achieved in apparatus for locating a centroid of a line section of a charged particle beam. The apparatus comprises a plurality of charged particle beam current sensors positioned along a line in the path of the beam at predetermined distances from a reference point. Each of the beam current sensors intercepts a component of the beam current. The apparatus further includes first means for summing each of the beam current components and for providing a first summation, second means for summing each of the beam current components weighted according to its distance from the reference point and for providing a second summation, and means for dividing the second summation by the first summation. The quotient is proportional to the distance between the reference point and the centroid of the charged particle beam sampled along the line defined by the beam current sensors.

In a preferred embodiment, the first means for summing comprises a first plurality of resistors each having one end electrically connected to one of the beam current sensors, having a value proportional to the distance between the beam current sensor to which it is connected and the reference point, and having its other end electrically connected to a first common point. The second means for summing comprises a second plurality of resistors having values equal to each other, each having one end electrically connected to one of the beam current sensors, having a value much greater than the largest of the first plurality of resistors, and having its other end electrically connected to a second common point. The current supplied through the second plurality of resistors to the second common point is divided by the current supplied through the first plurality of resistors to the first common point. The quotient is proportional to the distance between the reference point and the centroid of the charged particle beam sampled along the line defined by the beam current sensors.

The first plurality of resistors and the second plurality of resistors are typically located within the vacuum chamber with the charged particle beam generating system, and the first common point and the second common point are electrically connected through feedthroughs in the wall of the vacuum chamber. As a result, only two vacuum feedthroughs are necessary for ion beam centroid location and moving parts are not required. Also, no active electronic components such as diodes, transistors or integrated circuits are required within the vacuum chamber.

According to another aspect of the present invention, there is provided a method for locating a centroid of a line section of a charged particle beam comprising the steps of sensing charged particle beam current components at a plurality of locations at predetermined distances from a reference point, summing each of the beam current components and providing a first summation, summing each of the beam current components after weighting according to distance from the reference point and providing a second summation, and dividing the second summation, by the first summation, the quotient being proportional to the distance between the reference point and the centroid of the charged particle beam.

BRIEF DESCRIPTION OF THE DRAWINGS

For a better understanding of the present invention, together with other and further objects, advantages, and capabilities thereof, reference is made to the accompanying drawings which are incorporated herein by reference and in which.

DEATILED DESCRIPTION OF THE INVENTION

Figure 1:
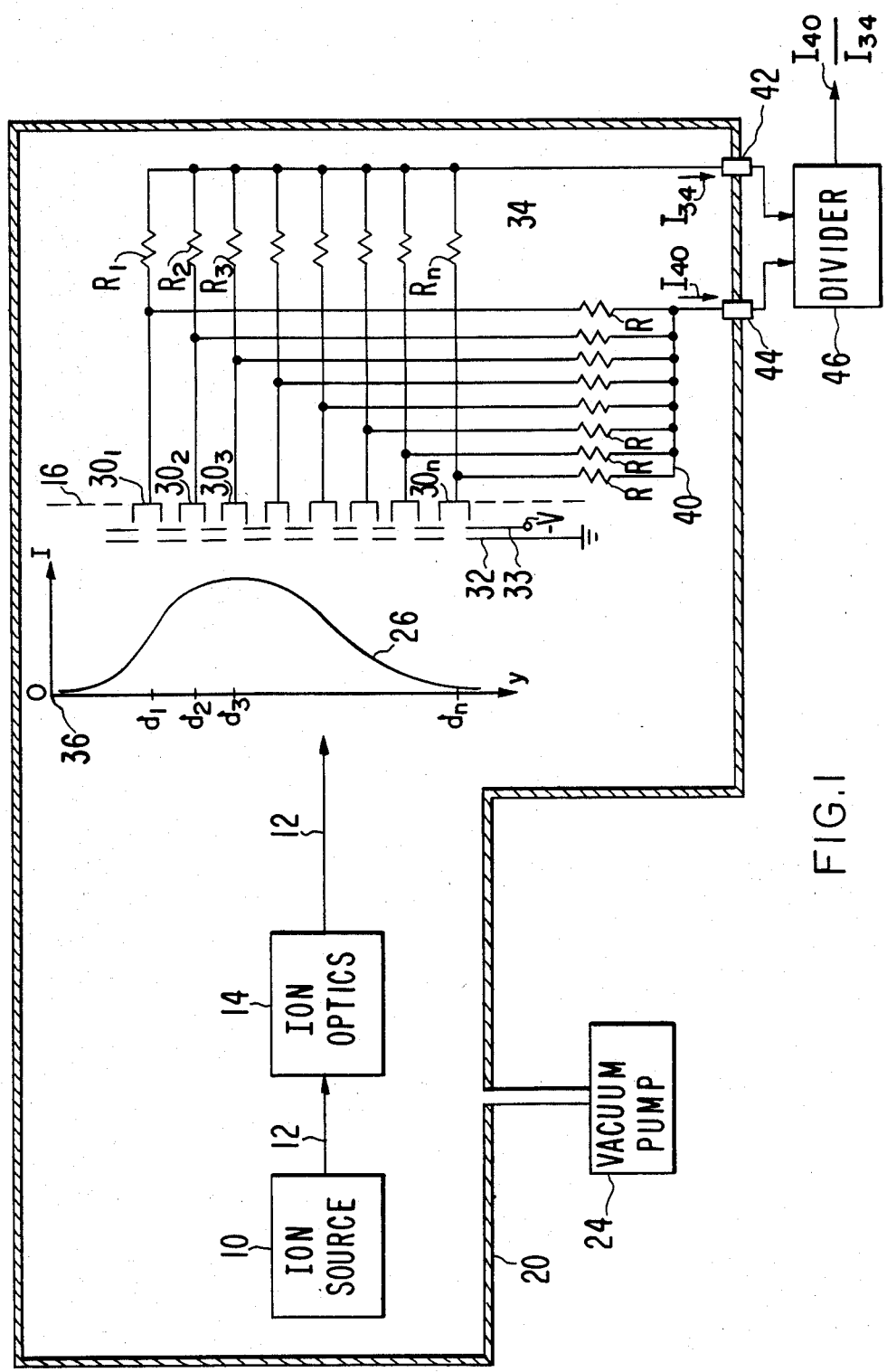
FIG. 1 is a schematic block diagram illustrating ion beam centroid location in accordance with the present invention.

A block diagram of a charged particle beam system in accordance with the present invention is shown in FIG. 1. The system described herein is an ion implantation system for impurity doping of semiconductor wafers and is shown in highly simplified form and not to scale in FIG. 1. It will be understood that the present invention is applicable to locating the centroid of any charged particle beam. An ion source 10 supplies a well-defined ion beam 12 which passes through ion optics 14, typically including beam acceleration, a mass analyzer and a resolving slit for removing undesired ion species, and focusing elements for focusing the beam in a target plane 16 where a target wafer is located for implantation. The system also includes means (not shown) for scanning the beam 12 relative to the wafer. The scanning means may be mechanical, electrostatic, magnetic, or a combination thereof. The system also includes means (not shown) for mounting and exchanging wafers. These elements form no part of the present invention and are not discussed further. The entire region between the ion source 10 and the target plane 16 is enclosed within a vacuum chamber 20 which is connected to a vacuum pumping system 24. The vacuum level within the chamber 20 is typically maintained at a pressure level of $10^{-5}$ Torr or lower during operation.

The ion beam 12 typically has a cross-sectional dimension at the target plane 16 on the order of one inch to five inches and a variation of intensity over its cross-sectional area. A graph of intensity I as a function of distance along the y axis has been superimposed on FIG. 1 to illustrate the beam intensity variation in the target plane. FIG. 1 shows the invention used to find the centroid along the y-direction by sampling the beam 12 at a typical location $x_0$ along the x-direction. The y-direction can correspond to the radial direction along an ion implantation disc. The curve 26 illustrates a typical intensity variation at the target plane 16. The intensity is not necessarily symmetrical about the axis of the ion beam 12 and depends on a variety of factors in the ion source and in the ion optical system.

Figure 2:
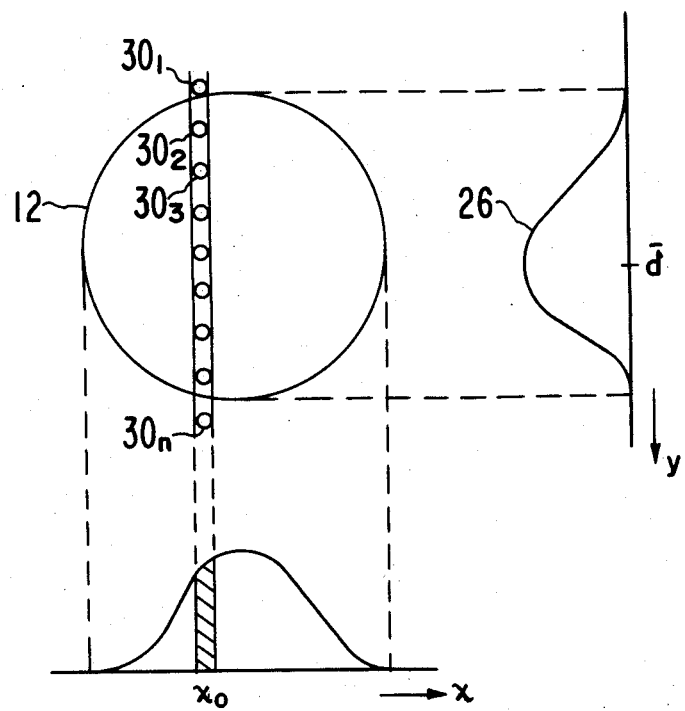
FIG. 2 is a schematic diagram illustrating the line section of the ion beam for which the centroid is found.

The apparatus for locating the centroid of the ion beam 12 includes a plurality of ion beam current sensors such as Faraday cups, $30_1$, $30_2$, $30_3$ ... $30_n$ positioned along a line perpendicular to the direction of travel of the beam 12. A view along the direction of travel of the beam 12 illustrating the relationship of the beam 12 and the Faraday cups $30_1$, $30_2$, $30_3$ ... $30_n$ is shown in FIG. 2. Projections of the beam 12 intensity in the x and y directions are shown. The centroid of the beam 12 is determined along the y-direction at a typical location along the x-direction. Thus, the centroid of a line section of the beam 12 is found. The Faraday cups are preferably located close to the target plane 16 so as to measure the beam impinging on the target wafer. The entrance to each of the Faraday cups $30_1$, $30_2$, $30_3$ ... $30_n$ is small in comparison with the cross-sectional area of the ion beam 12 so that each Faraday cup intercepts only a portion, or component, of the total ion beam 12. In front of each of the Faraday cups $30_1$, $30_2$, $30_3$ ... $30_n$ is an aperture mask 32 connected to ground. Between the mask 32 and the Faraday cups is a negatively biased electrode 33 for electron suppression. Each Faraday cup is a conductive enclosure with an opening facing the ion beam 12. Ions entering the Faraday cup cause a current to flow in the electrical circuit to which the Faraday cup is connected. The operation of Faraday cups in sensing charged particle beam current is well known in the art.

The Faraday cups $30_1$, $30_2$, $30_3$ ... $30_n$ are coupled to a first plurality of resistors $R_1$, $R_2$, $R_3$ ... $R_n$, respectively. The other ends of each of the resistors are $R_1$, $R_2$, $R_3$ ... $R_n$ are coupled to a first common point 34 located within the vacuum chamber 20. The value of each of the resistors $R_1$, $R_2$, $R_3$ ... $R_n$ is chosen to be relatively small and to be proportional to the distance between the Faraday cup to which it is connected and an arbitrary reference point 36. In the present example, the reference point is chosen as the origin of the graph upon which curve 26 is plotted. However, the reference point 36 can be at any convenient location outboard of the line of Faraday cups $30_1$, $30_2$, $30_3$ ... $30_n$.

Each of the Faraday cups $30_1$, $30_2$, $30_3$ ... $30_n$ is also connected to one end of a second plurality of resistors R, respectively. The other ends of the resistors R are connected to a second common point 40 within the vacuum chamber 20. The resistors R are equal in value to each other and have a value much greater than the largest of the resistors $R_1$, $R_2$, $R_3$ ... $R_n$. The ratio of resistors $R_i$ to resistor R should be smaller than the fractional precision required of the measurement. For example, $R_i/R = 1/1000$ gives 0.1% precision. The other factor determining precision is the number and size of the Faraday cups.

The first common point 34 is connected through a vacuum feedthrough 42 to one input of a divider 46 external to the vacuum chamber 20. The second common point 40 is connected through a vacuum feedthrough 44 to a second input of the divider 46. The divider 46 divides the current $I_{40}$ supplied through the second plurality of resistors R to the second common point 40 by the current $I_{34}$ supplied through the first plurality of resistors $R_1$, $R_2$, $R_3$ ... $R_n$ to the first common point 34. The result at the output of the divider 46 is proportional to the distance between the reference point 36 and the centroid of the ion beam 12.

In determining the centroid location, the beam 12 is held stationary relative to the array of Faraday cups $30_1, 30_2, 30_3 \ldots 30_n$. The current components intercepted by the Faraday cups pass through the first plurality of resistors $R_1, R_2, R_3 \ldots R_n$ and are summed at the first connection point 34 to form current $I_{34}$. The currents passing through the second plurality of resistors R are summed at the second connection point 40 to form current $I_{40}$. The current $I_{40}$ is divided by current $I_{34}$ in the divider 46 to obtain the location of the ion beam centroid as described hereinafter.

As noted above, the values of resistors $R_1, R_2, R_3 \ldots R_n$ are selected to be proportional to the distances between the Faraday cups $30_1, 30_2, 30_3 \ldots 30_n$ to which they are connected and the reference point 36. Thus, $$R_i = K d_i \quad (1)$$

where
K = a constant
$d_i$ = distance from Faraday cup i to reference point 36.

The values of R are equal to each other and are much larger than the largest value of $R_i$ to insure that most of the current flows through resistors $R_1, R_2, R_3 \ldots R_n$. A practical choice is $$R/(R_i)\text{max} > 1000 \quad (2)$$

Thus,
$$V_i = I_i R_i = K I_i d_i \quad (3)$$

where
$V_i$ = voltage across resistor $R_i$
$I_i$ = beam current received by Faraday cup $30_i$.

The current flowing to connection point 40 is, from equation (3), $$I_{40} = \sum_i \frac{V_i}{R} \quad (4)$$

$$= \frac{K}{R} \sum_i I_i d_i$$

The current flowing to connection point 34 is $$I_{34} = \sum_i I_i \quad (5)$$

The centroid of the ion beam 12 is, by definition $$\bar{d} = \frac{\sum_i I_i d_i}{\sum_i I_i} \quad (6)$$

where $\bar{d}$ is the distance between the reference point 36 and the centroid of ion beam 12.

Substituting equations (4) and (5) into equation (6) gives $$\bar{d} = \frac{R}{K} \cdot \frac{I_{40}}{I_{34}}$$

According to the present invention, the centroid $\bar{d}$ is calculated by dividing the current $I_{40}$ supplied to connection point 40 by the current $I_{34}$ supplied to connection point 34. As a result, only two vacuum feedthroughs 42, 44 are required to determine the ion beam centroid location.

The divider 46 can be any appropriate divider, such as an analog divider circuit. Alternatively, the divider 46 can employ current sensors which convert the current levels to digital form with the division being performed by a microprocessor or other CPU. It will be understood that the Faraday cups $30_1, 30_2, 30_3 \ldots 30_n$ can be located in a variety of patterns and locations for sensing the ion beam 12. Preferably, but not necessarily, the Faraday cups are located along a line parallel to the scan axis.

While there has been shown and described what is at present considered the preferred embodiment of the present invention, it will be obvious to those skilled in the art that various changes and modifications may be made therein without departing from the scope of the invention as defined by appended claims.

What is claimed is:

1. Apparatus for locating a centroid of a line section of a charged particle beam comprising:
a plurality of charged particle beam current sensors positioned along a line in the path of the beam at predetermined distances from a reference point, each of said beam current sensors intercepting a component of said beam and providing a beam current component;
first means for summing each of said beam current components and for providing a first summation;
second means for summing each of said beam current components weighted according to its distance from said reference point and for providing a second summation; and
means for dividing said second summation by said first summation, and for providing a quotient proportional to the distance between said reference point and the centroid of said charged particle beam sampled along the line defined by the beam current sensors.

2. Apparatus as defined in claim 1 wherein said first means for summing comprises a first plurality of resistors, each having one end electrically connected to one of said beam current sensors, having a value of resistance proportional to the distance between the beam current sensor to which it is connected and said reference point, and having its other end electrically connected to a first common point.

3. Apparatus as defined in claim 2 wherein said second means for summing comprises a second plurality of resistors having values of resistance equal to each other, each having one end electrically connected to one of said beam current sensors, having a value of resistance much greater than the largest of said first plurality of resistors, and having its other end electrically connected to a second common point.

4. Apparatus as defined in claim 3 wherein said dividing means includes means for dividing the current supplied through said second plurality of resistors to said second common point by the current supplied through said first plurality of resistors to said first common point.

5. Apparatus as defined in claim 1 wherein said beam current sensors each comprise a Faraday cup beam sensor.

6. Apparatus as defined in claim 5 wherein said beam current sensors are positioned along a line parallel to the scan axis of said beam.

7. Apparatus as defined in claim 3 wherein the values of resistance of said second plurality of resistors is at least one thousand times the value of the largest resistance of said first plurality of resisitors.

8. A method for locating a centroid of a line section of a charged particle beam comprising:
sensing current components of said charged particle beam at a plurality of locations along a line at predetermined distances from a reference point;
summing each of said beam current components and providing a first summation;
summing each of said beam current components after weighting according to distance from said reference point and providing a second summation; and
dividing said second summation by said first summation, and providing a quotient proportional to the distance between said reference point and the centroid of said charged particle beam sampled along the line on which the beam current components are sensed.

9. A method for centroid location as defined in claim 8 wherein the step of weighting said beam current components according to distance from said reference point includes passing each of said beam current components through associated resistors, each having a value of resistance proportional to the distance between the location at which the beam current component is sensed and said reference point, wherein a voltage across each resistor represents the weighted beam current component.

10. Apparatus for locating a centroid of a line section of an ion beam comprising:
a plurality of ion beam current sensors positioned along a line in the path of the beam at predetermined distances from a reference point, each of said beam current sensors intercepting a component of said beam;
a first plurality of resistors, each having one end electrically connected to one of said beam current sensors, having a value of resistance proportional to a distance between the beam current sensor to which it is connected and said reference point, and having its other end electrically connected to a first common point; a second plurality of resistors having values of resistance equal to each other, each having one end electrically connected to one of said beam current sensors, having a value of resistance much greater than the largest of said first plurality of resistors, and having its other end electrically connected to a second common point; and means for dividing the current supplied through said second plurality of resistors to said second common point by the current supplied through said first plurality of resistors to said first common point to provide the distance between said reference point and the centroid of said ion beam sampled along the line defined by the beam current sensors.

11. Apparatus comprising:
a vacuum chamber and means for evacuating said vacuum chamber;
means for generating an ion beam located within said vacuum chamber;
a plurality of ion beam current sensors positioned along a line in the path of the beam at predetermined distances from a reference point, each of said beam current sensors intercepting a component of said beam and providing a beam current component;
a first plurality of resistors, each having one end electrically connected to one of said beam current sensors, having a value of resistance proportional to the distance between the beam current sensor to which it is connected and said reference point, and having its other end electrically connected to a first common point;
a second plurality of resistors having values of resistance equal to each other, each having one end electrically connected to one of said beam current sensors, having a value of resistance much greater than the largest of said first plurality of resistors, and having its other end electrically connected to a second common point, said first plurality of resistors, said first common point, said second plurality of resistors and said second common point all being located within said vacuum chamber;
means positioned outside said vacuum chamber for dividing the current supplied through said second plurality of resistors to said second common point by the current supplied through said first plurality of resistors to said first common point to provide the distance between said reference and a centroid along a line section of said ion beam defined by the beam current sensors; and
first and second vacuum feedthroughs coupling said first and second common points, respectively, through said vacuum chamber to said dividing means.

* * * * *